(12) United States Patent
Boulard et al.

(10) Patent No.: US 11,329,095 B2
(45) Date of Patent: May 10, 2022

(54) BARRIER PHOTODETECTORS MATRIX WITH PIXELLATION BY LOCAL DEPLETIONS

(71) Applicant: COMMISSARIAT A L'ENERGIE ATOMIQUE ET AUX ENERGIES ALTERNATIVES, Paris (FR)

(72) Inventors: Francois Boulard, Grenoble (FR); Cyril Cervera, Grenoble (FR); Alexandre Ferron, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 163 days.

(21) Appl. No.: 16/780,974

(22) Filed: Feb. 4, 2020

(65) Prior Publication Data
US 2020/0258932 A1    Aug. 13, 2020

(30) Foreign Application Priority Data
Feb. 7, 2019 (FR) ........................ 19 01220

(51) Int. Cl.
*H01L 27/146* (2006.01)
*H01L 29/94* (2006.01)
*H01L 31/0224* (2006.01)
*H01L 31/0304* (2006.01)
*H01L 31/109* (2006.01)

(52) U.S. Cl.
CPC .... *H01L 27/14643* (2013.01); *H01L 27/1463* (2013.01); *H01L 27/14609* (2013.01); *H01L 27/14636* (2013.01); *H01L 29/94* (2013.01); *H01L 31/022408* (2013.01); *H01L 31/03046* (2013.01); *H01L 31/109* (2013.01); *H01L 27/14649* (2013.01); *H01L 27/14694* (2013.01)

(58) Field of Classification Search
CPC ......... H01L 27/14643; H01L 27/14609; H01L 27/1463; H01L 27/14636; H01L 29/94; H01L 31/022408; H01L 31/03046; H01L 31/109; H01L 27/14649; H01L 27/14694
See application file for complete search history.

(56) References Cited

U.S. PATENT DOCUMENTS

| 8,502,271 | B2 | 8/2013 | Scott | |
| 2008/0111152 | A1* | 5/2008 | Scott | ............... H01L 31/035281 |
| | | | | 257/188 |
| 2010/0258894 | A1* | 10/2010 | Inada | ................... H01L 27/1463 |
| | | | | 257/443 |

FOREIGN PATENT DOCUMENTS

| EP | 3 089 223 A1 | 11/2016 |
| EP | 3 407 392 A1 | 11/2018 |

OTHER PUBLICATIONS

U.S. Appl. No. 16/372,588, filed Apr. 2, 2019, 2019/0305017 A1, Boulard, F, et al.

(Continued)

*Primary Examiner* — Ermias T Woldegeorgis
(74) *Attorney, Agent, or Firm* — Oblon, McClelland, Maier & Neustadt, L.L.P.

(57) ABSTRACT

A photodetection device includes a pixel matrix in which each pixel includes a barrier photodetector. The pixel matrix includes an absorption layer, a barrier layer, a contact layer, and at least one separation element to delimit the pixels. At least one separation element extends above the contact layer, and forms at least one depletion zone that extends locally in the contact layer, to block the lateral circulation of charge carriers.

16 Claims, 4 Drawing Sheets

(56) References Cited

OTHER PUBLICATIONS

U.S. Appl. No. 16/668,954, filed Oct. 30, 2019, Daami, A, et al.
French Preliminary Search Report dated Nov. 4, 2019 in French Application 19 01220 filed on Feb. 7, 2019 (with English Translation of Categories of Cited Documents), 2 pages.

* cited by examiner

BARRIER PHOTODETECTORS MATRIX WITH PIXELLATION BY LOCAL DEPLETIONS

TECHNICAL FIELD

The invention relates to the field of barrier photodetectors, and more particularly to a matrix device comprising a plurality of barrier photodetectors.

STATE OF PRIOR ART

Barrier photodetectors are photodetection devices that comprise an absorption layer made of doped semiconducting material in which incident photons are absorbed and generate charge carriers, a barrier layer and a contact layer made of doped semiconducting material to polarise the photodetector, superposed on each other. Each of the absorption layer and the contact layer have a small value of the bandgap, or gap (or prohibited band width). The barrier layer is arranged between the absorption layer and the contact layer, and has a large gap. The difference in gap between the barrier layer and the absorption layer is majoritarily in either the conduction band or the valence band, such that the barrier layer forms a single-pole barrier for charge carriers from the absorption layer. The term "single-pole barrier" denotes a potential barrier that blocks a type of charge carrier (hole or electron) and allows the other type of charge carrier (electron or hole) to pass. In particular, the barrier layer forms a potential barrier that prevents the circulation of majority carriers, between the absorption layer and the contact layer, and that allows the circulation of minority carriers from the absorption layer to the contact layer. The barrier layer thus authorises transduction of a light signal into an electrical signal, by allowing minority carriers photogenerated in the absorption layer to pass into the contact layer, while limiting the darkness current of majority carriers, particularly by preventing them from being transported to the contact layer.

Matrices of photodetectors can be made, composed of a plurality of barrier photodetectors. The different pixels in such a matrix can share the same absorption layer and the same barrier layer, and each may have a dedicated contact zone. Contact zones of the different pixels are formed in the same contact layer, and each is isolated from adjacent contact zones by trenches. One disadvantage of this solution is that etching of the trenches generates material defects in the contact layer, on the flanks and on the bottom of the etched trenches. These material defects generate currents that degrade the sensitivity of photodetectors. Furthermore, the matrix of photodetectors thus made has a surface topology on which it is more difficult to deposit a passivation layer than on a plane surface. Finally, etching releases regions of the barrier layer than can be oxidised. This oxidation deteriorates photodetector performances, and limits manufacturing efficiencies.

In order to overcome these disadvantages, document U.S. Pat. No. 8,502,271 discloses a matrix of photodetectors in which the etched trenches are replaced by separation regions that extend directly in the contact layer. The separation regions have doping of the type opposite to the rest of the contact layer, and thus block the flow of majority carriers in the contact layer. This solution overcomes the disadvantages related to etching. However, incorporation and activation of doping elements in the contact layer generate structure defects that are sources of darkness current.

One purpose of this invention is to disclose a matrix photodetection device comprising a plurality of barrier photodetectors, and that does not have the disadvantages of prior art. In particular, one purpose of this invention is to disclose a matrix photodetection device comprising a plurality of barrier photodetectors, with a smaller darkness current than devices according to prior art.

PRESENTATION OF THE INVENTION

This objective is achieved with a photodetection device comprising a pixel matrix, in which each pixel comprises a barrier photodetector, and in which said pixel matrix comprises:
- an absorption layer, a barrier layer and a contact layer, arranged to be superposed with the barrier layer located between the absorption layer and the contact layer, in which the barrier layer is capable of forming a potential barrier blocking the circulation of majority carriers between the absorption layer and the contact layer and allowing the circulation of minority carriers from the absorption layer to the contact layer; and
- at least one separation element, to delimit the pixels of said pixel matrix.

The term "barrier photodetector" is defined in the introduction.

The barrier layer is able to form a potential barrier blocking the circulation of majority carriers (from the absorption layer and from the contact layer respectively) between the absorption layer and the contact layer. In other words, said potential barrier blocks the circulation of majority carriers in one direction and/or the other direction, between the absorption layer and the contact layer. In particular, it can block the circulation of majority carriers from the absorption layer, from the absorption layer to the contact layer. Furthermore, said potential barrier enables the circulation of minority carriers from the absorption layer, from the absorption layer to the contact layer.

The circulation, or transport, or collection of charge carriers is for example made by diffusion of carriers, or by drift under the effect of an electric field.

The contact layer is a layer of electrically conductive small gap semiconductor material. In particular, it has a bandgap strictly smaller than that of the barrier layer. The contact layer is able to make a contact of the Ohmic type with at least one electrical contact pad. The at least one electrical contact pad is preferably made of metal.

It is understood that, in operation, the collection of charge carriers takes place in the contact layer.

According to the invention, the at least one separation element extends above the contact layer on the side opposite the barrier layer. The at least one separation element is capable of forming at least one depletion zone. Said at least one depletion zone extends in the contact layer and forms a potential barrier blocking the circulation of charge carriers from one pixel to another in the pixel matrix.

In other words, the basic concept of the invention consists of delimiting pixels using a potential barrier, formed in the contact layer under the effect of a separation element external to said contact layer.

A depletion zone or a deserted zone is a zone without any free charge carriers, or majority carriers, in a doped semiconducting material. For example, a depletion zone is formed in a p-n (or n-p) junction diode, due to the diffusion of charge carriers around the junction. A depletion zone can also be formed under the effect of an electric field, in the layer of semiconducting material of a Metal-Oxide-Semiconductor capacitor (MOS capacitor). Other electronic devices based on semiconducting material can also have a depletion zone.

In a depletion zone, the electrical potential progressively changes from a low value to a high value. It is therefore understood that the presence of a depletion zone in the contact layer results in the presence, in the contact layer, of an inverted potential well centred on said depletion zone. Therefore the at least one depletion zone according to the invention forms a potential barrier that extends in the contact layer at said depletion zone. This potential barrier blocks the lateral transport of charge carriers in the contact layer. The potential barrier thus delimits a plurality of zones in the contact layer, thus defining the pixels in the pixel matrix.

Therefore according to the invention, the at least one depletion zone and the associated potential barrier extend in the contact layer, between the pixels of the photodetectors matrix, and preferably along intersecting lines.

The at least one depletion zone according to the invention is formed using the at least one separation element. This separation element with the contact layer forms a structure that can generate a depletion zone in the contact layer. Said structure may for example be a MOS capacitor or a semiconductor stack with p-n (or n-p) junction. The separation element extends above the contact layer on the side of the contact layer opposite the barrier layer, and preferably directly on the contact layer. It does not project inside the contact layer, so that it does not modify the chemical composition or the crystalline structure of the contact layer. Nor is there any need to etch the contact layer.

The invention thus provides a solution to delimit individual photodetectors of the barrier photodetector type, in a stack comprising an absorption layer, a barrier layer and a contact layer, and that does not have the disadvantages related to this pixellation in prior art. In particular, the invention overcomes the disadvantages related to etching of the contact layer, or to the implantation of impurities in this contact layer. An interpixel zone in the contact layer does not have a higher density of structure defects nor a chemical composition different from the rest of the contact layer. Thus, structure defects that cause a darkness current in prior art are eliminated. Furthermore, the invention eliminates the risk of oxidation of the barrier layer related to etching of the contact layer. The invention also facilitates the deposition of a passivation layer to protect the contact layer, due to a plane configuration. Finally, a sensitive step for the implantation or local diffusion of dopants in the contact layer is avoided, which makes manufacturing more efficient than in prior art.

In operation, the absorption layer is advantageously not depleted.

Advantageous and optional characteristics are mentioned in the dependent claims.

The invention also covers a photodetection system comprising a photodetection device according to the invention and a plurality of electrical contact pads, in which the electrical contact pads extend directly on the contact layer, in direct physical contact with the latter on the side opposite to the barrier layer, and each establish with the contact layer an electrical contact of ohmic type. The electrical contact pads are preferably made of metal.

BRIEF DESCRIPTION OF THE DRAWINGS

This invention will be better understood after reading the description of example embodiments given purely for information and that are in no way limitative, with reference to the appended drawings on which.

DETAILED PRESENTATION OF PARTICULAR EMBODIMENTS

Figure 1:
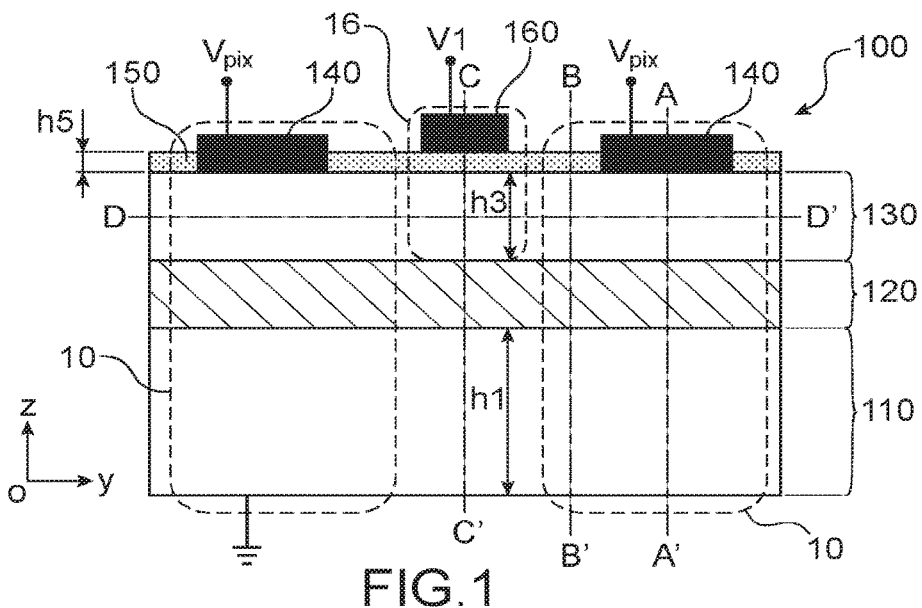
FIG. 1 diagrammatically illustrates a sectional view of a first embodiment of a photodetection device according to the invention.

FIG. 1 illustrates a sectional view, in the (y0z) plane of an orthonormal coordinate system (0xyz), of a photodetection device 100 according to a first embodiment of the invention.

The photodetection device 100 comprises the following, superposed one above the other along the (0z) axis:
an absorption layer 110;
a barrier layer 120; and
a contact layer 130.

This stack of layers forms a hetero-structure, that is made for example by molecular beam epitaxy on a GaSb substrate.

Each of these layers extends in a plane parallel to the (x0y) plane, parallel to the plane of the pixel matrix as defined in the following. The barrier layer 120 extends between the absorption layer 110 and the contact layer 130, in direct physical contact with these layers along planes parallel to the (x0y) plane.

The absorption layer 110 is composed of a doped semiconducting material, in this case n-doped (excess of electrons). The semiconducting material may for example be an indium, arsenic and antimony alloy. The absorption layer 110 will absorb photons for which the wavelength is within the spectral sensitivity range of the photodetection device 100. During operation, the photons absorbed in the absorption layer 110 generate charge carriers in this layer, and particularly minority carriers that circulate as far as the barrier layer 120. In this case, the minority carriers are holes, positively charged. The absorption layer 110 has a thickness h1 of a few micrometres, similar to a light absorption depth in the material of the absorption layer at wavelengths detected by the photodetection device 100. The thickness h1 is measured along an axis (0z) orthogonal to the (x0y) plane of the absorption layer 110. The absorption layer 110 has a first gap value, $\Delta E_1$.

The barrier layer 120 is composed of a semiconducting material, preferably doped with the same doping type as the absorption layer 110. The semiconducting material may for example be an aluminium, arsenic and antimony alloy. The barrier layer 120 has a second gap value, $\Delta E_2$, wherein $\Delta E_2$ is greater than $\Delta E_1$. The gap difference between the barrier layer 120 and the absorption layer 110 is in this case majoritarily on the conduction band, such that the barrier layer 120 forms a single-pole barrier that blocks the circulation of majority carriers (electrons) from the absorption layer 110, and authorises the circulation of minority carriers (holes) from the absorption layer.

The contact layer 130 is composed of a doped semiconducting material, in this case an n doped material. The semiconducting material may be composed of the same chemical elements as the material of the absorption layer 110, possibly in the same proportions. In this case the contact layer 130 is composed of an indium, arsenic and antimony alloy. The contact layer 130 has a thickness h3 less than one micrometre, preferably less than 500 nm. The thickness h3 is measured along the (0z) axis. The contact layer 130 will polarise the photodetection device 100. To achieve this, a plurality of electrical contact pads 140 extend in direct physical contact with the contact layer 130, on the side opposite the barrier layer 120. During operation, these metallic electrical contact pads 140 are connected to a voltage source that can supply a polarisation voltage Vpix, in this case a negative voltage.

During operation, absorption of photons in the absorption layer 110 generates minority carriers in this layer, in this case positively charged, that circulate as far as the contact layer 130 passing through the barrier layer 120, and generate an electrical signal that can be measured using the electrical contact pads 140. Majority carriers, in this case negatively charged, are prevented from circulating from the absorption layer 110 to the contact layer 130, due to the barrier layer 120. The photodetection device 100 described herein is an "nBn" type device, which means the stack of an n doped absorption layer, a barrier layer and an n doped contact layer.

The contact layer 130 is covered by a layer 150 of electrically insulating material. The layer 150 extends directly on the contact layer 130 on the side opposite the barrier layer 120, except at the locations of the electrical contact pads 140. For example, the layer 150 may be made of silicon dioxide or any other oxide such as for example $SiO_x$, $HfO_x$ or an $SiN_x$ type nitride. The layer 150 preferably performs a function to protect the contact layer 130, in addition to its electrically insulating function. In other words, it also forms a passivation layer on the contact layer 130. The thickness h5 of the layer 150 is preferably between 10 nm and 300 nm. The thickness h5 is measured along an axis (0z) orthogonal to the (x0y) plane of the layer 150.

The layer 150 can be deposited using any classical technique for the deposition or growth of a single-layer or multi-layer such as oxidation and thermal nitridation, deposition by cathodic sputtering or ion beam, deposition by atomic layer, electrochemistry, etc.

The photodetection device 100 also comprises metallic bands 160, that extend in an (x0y) plane parallel to the planes of layers 110, 120 and 130. The metallic bands 160 extend in direct physical contact with the layer 150, on the side opposite the contact layer 130. They are electrically insulated from the electrical contact pads 140, in this case separated from them by a space. The metallic bands 160 are formed from one or several metal layers, each layer possibly being made of gold, titanium, nickel, platinum or an alloy of at least two of these metals. The metallic bands 160 are electrically connected to a voltage source, not shown, capable of supplying a polarisation voltage V1, in this case a negative voltage. The absolute value of V1 is greater than the absolute value of Vpix. The absolute value of V1 is preferably between 0.5 V and 5 V.

The metallic bands 160 are advantageously made by local openings in the layer 150, by photolithography and etching. Classical wet or dry etching processes can be used. For example, in the case of an $SiO_2$ layer 150, fluorine plasma etching can open the layer 150 selectively relative to the contact layer 130. One or several metallic layers are then deposited, that are etched by photolithography and by ion abrasion. These steps are advantageously followed by known steps to make contact, hybridization on read circuit, and removal of a support substrate, in this case the GaSb substrate.

The stack composed of metallic bands 160, and portions of layers 150 and 130 located facing said bands, forms a MOS capacitor, reference 16 on FIG. 1.

The following contains a description of energy profiles in the valence band and the conduction band, at different sections in the device 100. These profiles correspond to the device 100 in operation, with the metallic bands 160 polarised by the voltage V1, the electrical contact pads 140 polarised by the voltage Vpix, and the absorption layer 110 connected to the ground.

Figure 2A:
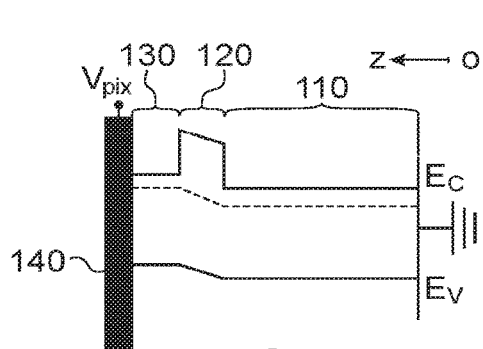
FIGS. 2A to 2D illustrate energy profiles in the device in FIG. 1.

FIG. 2A illustrates energy profiles in the valence band (Ev) and the conduction band (Ec), along an axis AA' parallel to the (0z) axis and passing through an electrical contact pad 140.

Figure 2B:
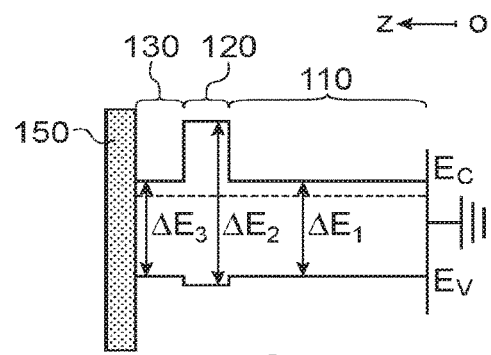

FIG. 2B illustrates energy profiles in the valence band (Ev) and the conduction band (Ec), along an axis BB' parallel to the (0z) axis and passing outside an electrical contact pad 140 and outside a metallic band 160.

The profiles in FIG. 2B relate to the situation with no polarisation of the contact layer 130. As described above, the gap in the absorption layer 110 is equal to the value $\Delta E_1$, while the gap in the barrier layer 120 is equal to the value $\Delta E_2$ much higher than $\Delta E_1$. In the contact layer 130, the gap is equal to a third value $\Delta E_3$ equal to approximately $\Delta E_1$, much less than $\Delta E_2$. The energy profiles of the valence and conduction bands are adapted such that when the contact layer 130 is polarised, the barrier layer can selectively block the majority carriers flow from the absorption layer and allow the minority carriers flow to pass. In the case of an "nBn" type device as described herein, this results in a small energy difference at the valence bands, between firstly the barrier layer and secondly the absorption and contact layers, and a large energy difference at the conduction bands, between these same bands. In other words, the gap difference between said layers is majoritarily on the conduction band. In this case, the energy of the conduction band is in the form of a crenel, with a high value in the barrier layer and low values in the absorption and contact layers. The energy of the valence band is in the form of a crenel, with a low value in the barrier layer and slightly higher values in the absorption and contact layers.

The energy profiles illustrated in FIG. 2B, when the contact layer 130 is slightly polarised, can obtain the required effect of selectively blocking charge carriers at the barrier layer 120, as illustrated in FIG. 2A.

Figure 2C:
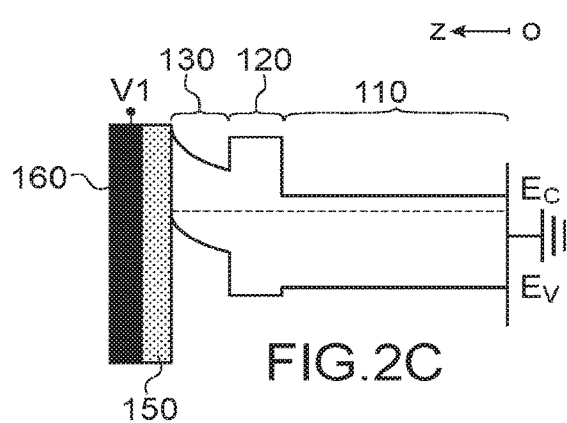

FIG. 2C illustrates energy profiles in the valence band (Ev) and the conduction band (Ec), along an axis CC' parallel to the (0z) axis and passing through a metallic band 160. The profiles in FIG. 2C correspond to the profiles in FIG. 2B, except at the contact layer 130. In the contact layer 130, the MOS capacitor formed by the contact layer 130, the layer 150 and the metallic band 160, forms a depletion zone. This results in a strong increase in the average energy of the valence and conduction bands, in the contact layer 130. In the contact layer 130, the energy in the conduction band has a gradient that decreases along the (0z) axis, as the distance from the metallic band 160 increases. The energy on the valence band has the same profile as on the conduction band. These energy profiles correspond to the local presence of a potential barrier that extends in the contact layer 130 facing the metallic band 160.

At the interface between the contact layer 130 and the barrier layer 120, the energy on the conduction band on the side of the contact layer 130 is less than the energy on the conduction band on the side of the barrier layer 120. Thus, the appearance of the potential barrier in the contact layer 130 does not disturb operation of the barrier layer as a single-pole barrier.

Figure 2D:
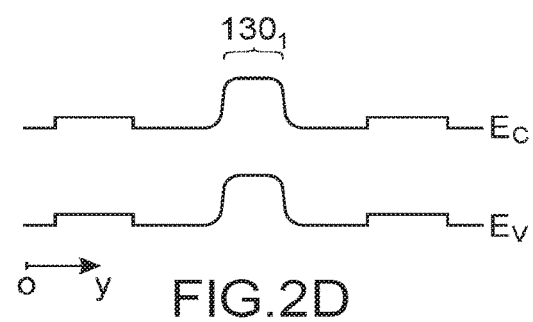

FIG. 2D illustrates energy profiles in the valence band (Ev) and the conduction band (Ec), along an axis DD' extending at mid-height in the contact layer 130, in a plane parallel to the (x0y) plane. The energy difference between the valence band and the conduction band is constant along the DD' axis. Each of the energy profiles comprises bumps located in regions $130_1$ of the contact layer, each extending facing a metallic band. The bumps project well beyond other zones on the energy profiles, which corresponds well to the presence of a potential barrier that extends in the contact layer 130, facing the metallic bands 160.

Due to these potential barriers, the charge carriers and particularly the majority carriers, are prevented from circulating in the contact layer 130 through regions $130_1$ located facing the metallic bands 160.

Figure 3:
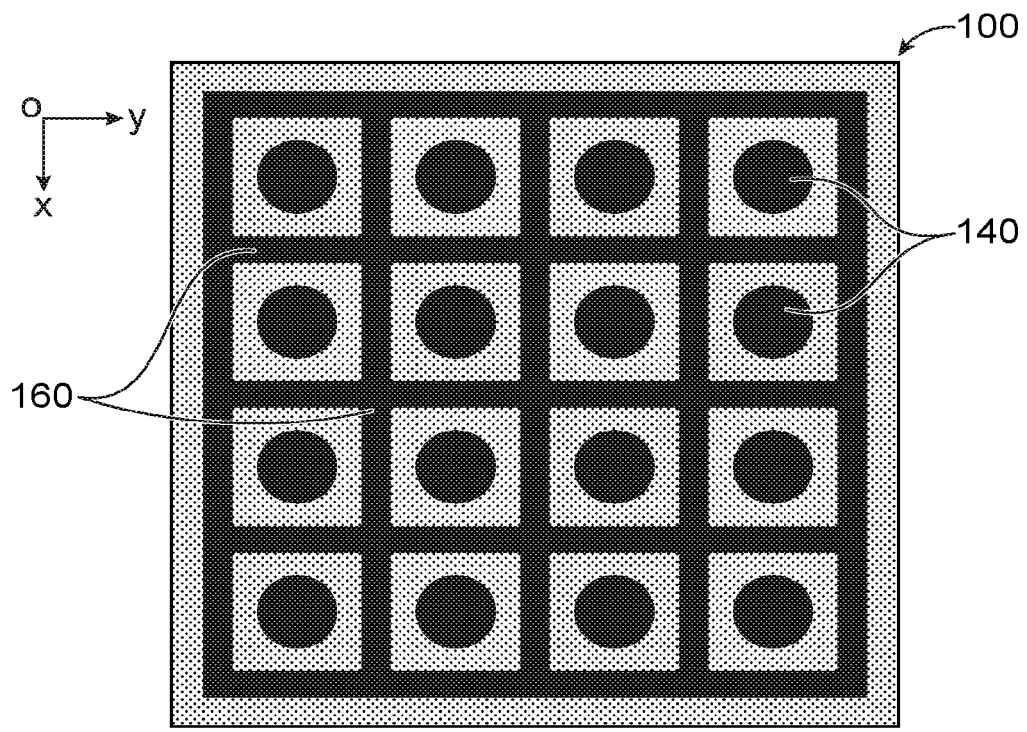
FIG. 3 diagrammatically illustrates a top view of the device in FIG. 1.

FIG. 3 represents a top view of the device 100. As illustrated in FIG. 3, the metallic bands 160 extend along separation lines, on the layer 150. The orthogonal projection of these separation lines, in an (x0y) plane containing the contact layer 130, forms lines that delimit a series of zones in the contact layer 130, in which each zone receives one and only one electrical contact pad 140. The metallic bands 160 thus delimit a plurality of pixels 10 in the photodetection device 100, in which each pixel 10 comprises one and only one electrical contact pad 140. In this case, the metallic bands 160 extend particularly in a grid, with an electrical contact pad 140 in each hole in the grid. The grid is composed of lines each of which extends continuously from one edge of the pixel matrix to the other.

Due to the metallic bands 160 and the layer 150 made of an electrically insulating material, the stack comprising the absorption layer 110, the barrier layer 120 and the contact layer 130 thus forms a matrix of pixels in which each pixel 10 comprises a barrier photodetector. The metallic bands 160 and the layer 150 made of an electrically insulating material together form separation elements to delimit the pixels 10 of said matrix. In this case the separation elements extend directly on the contact layer, on the side opposite the barrier layer. They form depletion zones that extend locally into the contact layer 130. The energy levels in these depletion zones form potential barriers that extend locally in the contact layer and prevent majority charge carriers in the contact layer from circulating in the contact layer from one pixel in the pixel matrix to the others. The pixel matrix is a plane matrix because the contact layer 130 does not have trenches between the pixels.

Preferably, each of the potential barrier and the associated depletion zone extends across the entire thickness of the contact layer. An expert in the subject will know how to size the device according to the invention so as to obtain this characteristic, particularly by adjusting the thickness and the doping density of the contact layer 130.

In particular, in the case in which the absolute value of the polarisation voltage V1 is sufficiently high to reach the strong inversion regime (namely an absolute value of the voltage generally between 500 mV and 5 V), the maximum depletion distance $W_{Dm}$ of majority carriers in the contact layer 130 is given by the equation:

$$W_{Dm} \approx \sqrt{\frac{4\varepsilon_{sc}kT\ln\left(\frac{N_d}{n_i}\right)}{q^2 N_d}}$$

wherein $N_d$ is the doping density in the contact layer 130, q is the elementary electrical charge, T is the temperature, k is the Boltzmann constant, $\varepsilon_{sc}$ is the dielectric permittivity of the material in the contact layer 130, and $n_i$, is the intrinsic density of carriers in the contact layer 130.

Values of the thickness and doping density of the contact layer 130 can be deduced from this equation, such that the depletion zone can extend across the entire thickness of the contact layer 130.

Figure 4:
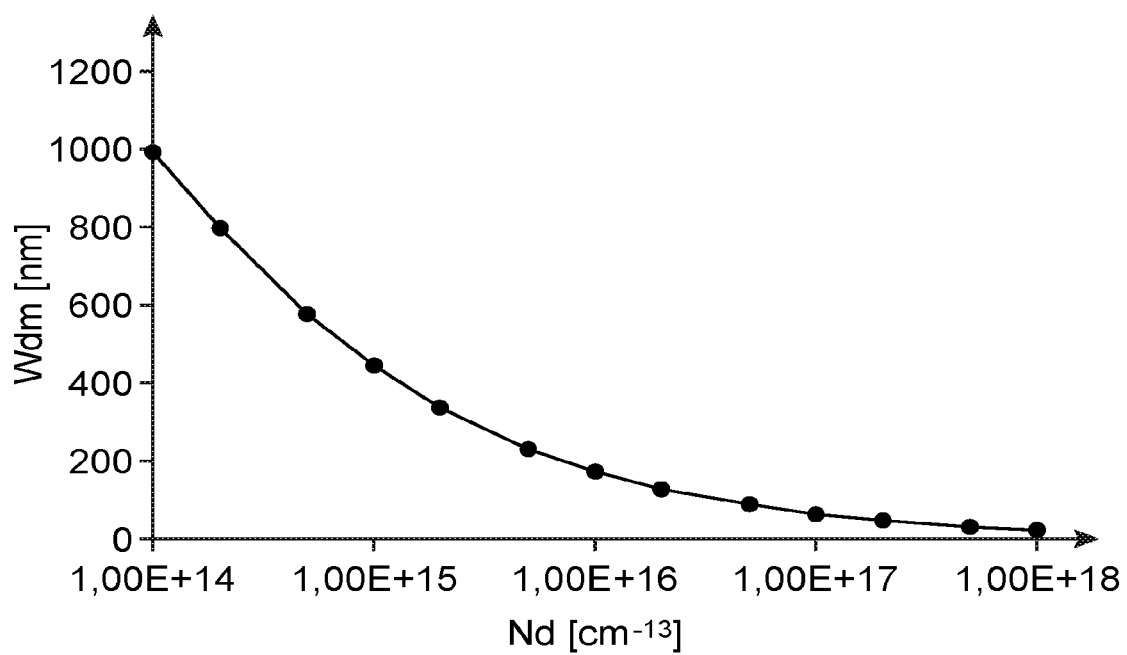
FIG. 4 illustrates a thickness of the depletion zone in the contact layer, as a function of a doping density of said contact layer, in the embodiment in FIG. 1.

FIG. 4 illustrates the variation $W_{Dm}$ (ordinate axis, in nm) as a function of the doping density in the contact layer 130 (abscissa axis, in $cm^{-3}$, in logarithmic scale). In this case, the contact layer 130 is made of n doped $InAs_{0.8}Sb_{0.2}$, at a temperature of 150 K, with a dielectric permittivity $\varepsilon_{sc}$ equal to 15, and an intrinsic density of carriers $n_i$, equal to $10^{13}$ $cm^{-3}$. It can be seen that a 100 nm thick contact layer may be depleted in majority carriers over its entire thickness if its doping is less than $3\times10^{16}$ $cm^{-3}$. It can also be seen that a contact layer for which the doping density is equal to $10^{15}$ $cm^{-3}$ leads to a maximum depletion distance of 440 nm.

In a manner known in the field of MOS capacitors, the thickness and the permittivity of the layer 150 influence the minimum absolute value of the polarisation voltage V1 to be applied to the metallic bands. This threshold voltage also depends on the doping density of the contact layer.

The metallic bands 160 and the electrical contact pads 140 may be composed of the same material.

The metallic bands 160 and the electrical contact pads 140 may be formed during the same technological manufacturing step of a device according to the invention, which can increase the manufacturing rate and eliminate the misalignment inherent to the use of two technological steps. As a variant, a first metallisation is used to form electrical contact pads 140, and a second metallisation is used to form the metallic bands 160. The first metallisation can be made before deposition of the layer 150 that also forms the passivation layer. This means that a step can be performed to cure the interface between the contact layer and the electrical contact pads 14, particularly to improve the ohmic contact. The lack of passivation at this curing step makes it possible to use processes that would not resist passivation, for example heat treatments at high temperature.

Figure 5:
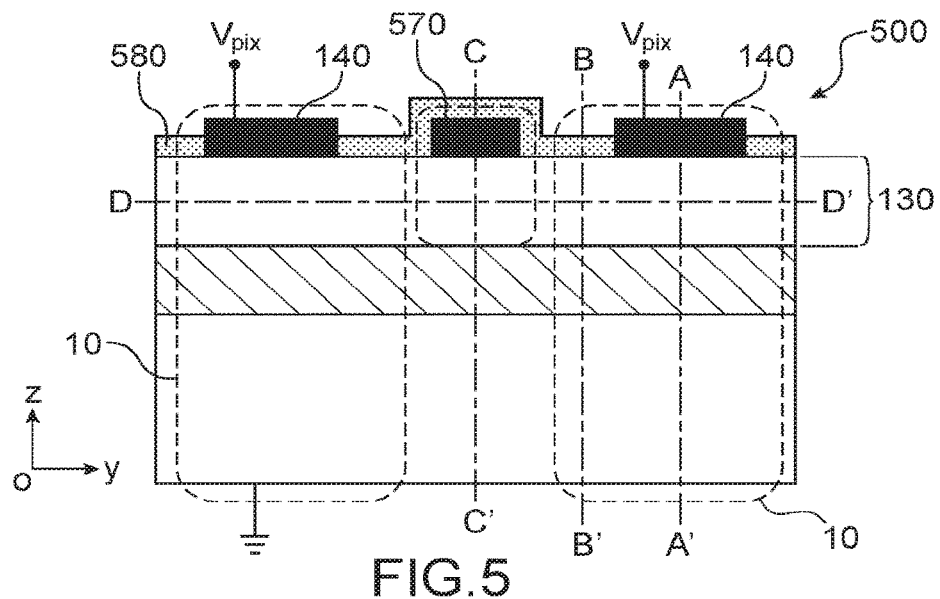
FIG. 5 diagrammatically illustrates a sectional view of a second embodiment of a photodetection device according to the invention.

FIG. 5 illustrates a sectional view in the (y0z) plane of an orthonormal coordinate system (0xyz) of a photodetection device 500 according to a second embodiment of the invention. Only the differences between the photodetection device 500 and the device 100 according to the first embodiment of the invention will be described. In this case, the separation elements to delimit the pixels 10 are formed more particularly by doped bands 570 made of a semiconducting material. The doped bands 570 have a doping type opposite to the doping type of the contact layer 130, and extend in direct physical contact with the contact layer 130 so as to form a plane p-n (or n-p) junction with this contact layer. In this case, the contact layer 130 is n doped, and the doped bands 570 are p doped. A passivation layer 580 covers the contact layer 130 and the doped bands 570, except at the locations of the electrical contact pads 140.

The stack composed of the doped bands 570 and the portions of the contact layer 130 located facing said bands comprises a depletion zone, that extends both in the doped bands 570 and in the contact layer 130.

FIGS. 6A to 6D illustrate energy profile, for different sections in the device 500 in FIG. 5. These profiles correspond to the device 500 in operation, with the electrical contact pads 140 polarised by the voltage Vpix and the absorption layer 110 connected to the ground. Preferably, and as is the case herein, the doped bands 570 are not polarised and therefore they are not connected to any voltage source. Depletion is then assured solely by adjustment of thicknesses and dopings of the contact layer and the doped bands. Thus, there is no need to use a special circuit managing polarisation of the doped bands.

Figure 6A:
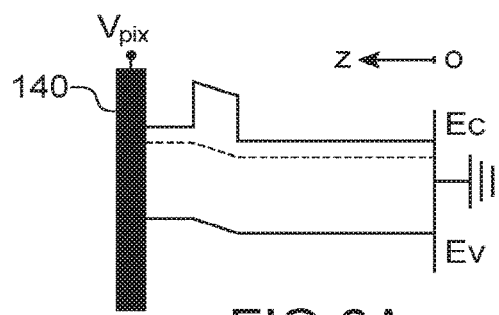
FIGS. 6A to 6D illustrate energy profiles in the device in FIG. 5.
Figure 6B:
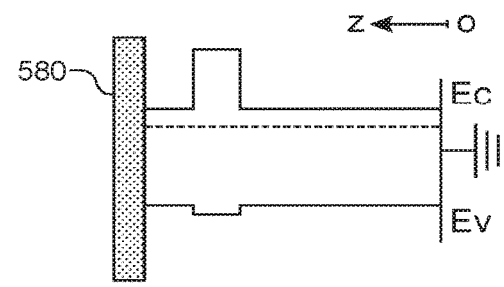

FIGS. 6A and 6B illustrate energy profiles in the valence band (Ev) and the conduction band (Ec), along an axis AA' and an axis BB' respectively, both parallel to the (0z) axis and passing through an electrical contact pad 140 and between such a pad and a doped band 570, respectively. FIGS. 6A and 6B are identical to FIGS. 2A and 2B respectively.

Figure 6C:
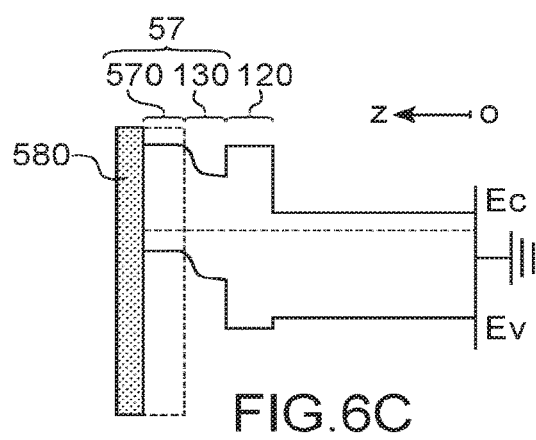

FIG. 6C illustrates energy profiles in the valence band (Ev) and the conduction band (Ec), along an axis CC' parallel to the (0z) axis and passing through a doped band 570. The energy profiles in FIG. 6C correspond to the energy profiles in FIG. 6B, except at the contact layer 130 and the doped band 570. In the assembly 57 formed by the contact layer 130 and the doped band 570, the p-n junction forms a depletion zone. This results in a strong local increase in the average energy of the valence and conduction bands, in this assembly 57. In this assembly 57, the energy of the conduction band has a gradient centred substantially on the p-n junction between the doped band 570 and the contact layer 130, and decreasing along the (0z) axis with decreasing distance from the barrier layer 120. The energy on the valence band has the same profile as on the conduction band. These energy profiles correspond to the local presence of a potential barrier that extends particularly in the contact layer 130 facing the doped band 570.

At the interface between the contact layer 130 and the barrier layer 120, the energy on the conduction band on the side of the contact layer 130 is less than the energy on the conduction band on the side of the barrier layer 120. Thus, the appearance of the potential barrier in the contact layer 130 does not disturb operation of the barrier layer as a single-pole barrier.

Figure 6D:
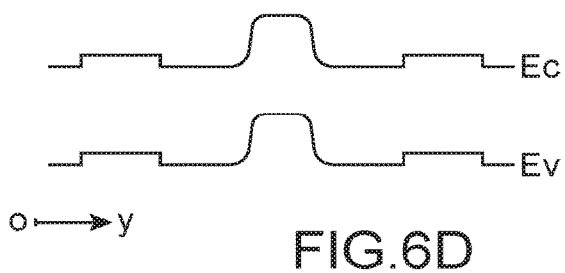

FIG. 6D illustrates energy profiles in the valence band (Ev) and the conduction band (Ec), along an axis DD' extending at mid-height in the contact layer 130, in a plane parallel to the (x0y) plane. The profiles obtained are the same as those in FIG. 2D, demonstrating the presence of a potential barrier that extends in the contact layer 130, in this case facing the doped bands 570.

As in the first embodiment, these potential barriers prevent charge carriers from circulating in the contact layer 130 through the regions that in this case are located facing the doped bands 570.

Like the metallic bands in the first embodiment, the doped bands 570 extend along separation lines, so as to delimit a plurality of pixels 10 in the photodetection device 500, in which each pixel 10 comprises one and only one electrical contact pad 140.

Preferably, each of the potential barrier and the associated depletion zone extends across the entire thickness of the contact layer. An expert in the subject will know how to size the device according to the invention so as to obtain this characteristic, particularly by adjusting the thicknesses and doping densities of the contact layer 130 and the doped bands 570.

In particular, the extension $W_{ZCE}$ of the depletion zone is the sum of its extension $W_{nZCE}$ in the contact layer and its extension $W_{pZCE}$ in the doped bands, in which:

$$W_{nZCE} N_d = W_{pZCE} N_a$$

where Nd is the doping density in the contact layer 130 and Na is the doping density in the doped bands 570. Furthermore, the total extension $W_{ZCE}$ is given by:

$$W_{ZCE} = \sqrt{\frac{2\varepsilon_{sc}}{q}\left(\frac{1}{Na} + \frac{1}{Nd}\right)(V_{BI} - V)}$$

where q is the elementary electrical charge, k is Boltzmann's constant, $\varepsilon_{sc}$ is the dielectric permittivity of the material of the contact layer 130, V is a polarisation voltage of doped bands, and $V_{BI}$ is given by the equation:

$$V_{BI} = \frac{kT}{q}\ln\left(\frac{Na \cdot Nd}{n_i^2}\right)$$

wherein T is the temperature and n is the intrinsic density of carriers in the contact layer 130.

Values of the thickness and doping density of the contact layer 130, and the doping density of the doped bands 570, can be deduced from these equations, such that the depletion zone can extend across the entire thickness of the contact layer.

Figure 7:
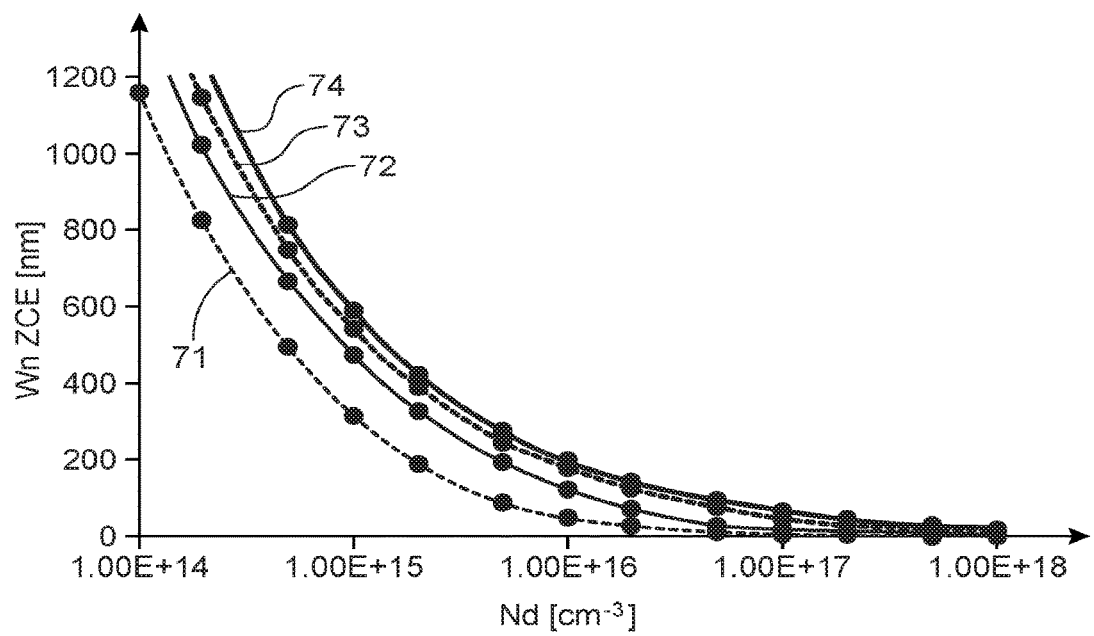
FIG. 7 illustrates a thickness of the depletion zone in the contact layer, as a function of a doping density of said contact layer, in the embodiment in FIG. 5.

FIG. 7 illustrates the variation $W_{nZCE}$ (ordinate axis, in nm) as a function of the doping density in the contact layer 130 (abscissa axis, in cm$^{-3}$, in logarithmic scale), and for different values of the doping density in the doped bands 570. In this case, the contact layer 130 is made of n doped InAs$_{0.8}$Sb$_{0.2}$, at a temperature of 150 K, with a dielectric permittivity $\varepsilon_{sc}$ equal to 15, and an intrinsic density of carriers $n_i$, equal to $10^{13}$ cm$^{-3}$. Curves 71, 72, 73, 74 correspond to doping densities in the doped bands equal to $10^{15}$ cm$^{-3}$, $10^{16}$ cm$^{-3}$, $10^{17}$ cm$^{-3}$, and $10^{18}$ cm$^{-3}$ respectively. For example, it can be seen that a contact layer with a doping density less than or equal to $10^{15}$ cm$^{-3}$ is fully depleted over thicknesses of 310 nm, 475 nm, 540 nm, 590 nm respectively, for doping densities of the doped bands equal to $10^{15}$ cm$^{-3}$, $10^{16}$ cm$^{-3}$, $10^{17}$ cm$^{-3}$, et $10^{18}$ cm$^{-3}$ respectively. Therefore, to assure compete depletion of the contact layer, its thickness must be less than these values. Furthermore, the thickness of the doped band must be more than $W_{pZCE}$ to provide all carriers necessary for formation of the depletion zone. For example, a thickness of 200 nm and a doping density Nd of $10^{15}$ cm$^{-3}$ are chosen for the contact layer, and a thickness of 20 nm and a doping density Na of $10^{17}$ cm$^{-3}$ are chosen for the doped bands. Under these conditions, $W_{nZCE}$ is equal to 540 nm, which is a value much larger than the thickness of the contact layer, such that the depletion zone can extend across the entire thickness of said contact layer. Furthermore, $W_{pZCE}$ is equal to 5 nm, which is a value much less than the thickness of the doped bands.

In this second embodiment, the doped bands are advantageously made by growth and then localised etching of a doped semiconducting layer, in this case p doped. Etching is not critical. As demonstrated above, the thicknesses can be sized such that the contact layer is much thicker than the doped bands. Thus, there is a wide depth tolerance for etching, that can penetrate slightly into the contact layer without hindering correct operation of the device according to the invention. The shallow etching depth also facilitates passivation of the etching flanks. Furthermore, etching does not continue onto a layer that can be oxidised.

Figure 8A:
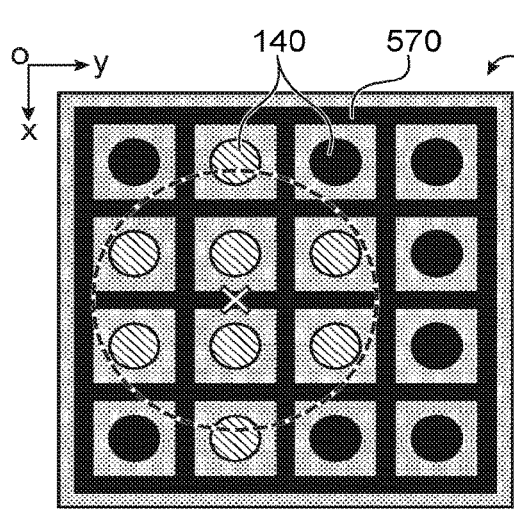
FIGS. 8A et 8B diagrammatically illustrate top views of two variants of the device in FIG. 5.

FIG. 8A illustrates a top view of the device 500 in FIG. 5. It can be seen that the doped bands 570 extend in a continuous grid, composed of straight lines each of which extends continuously from one edge of the pixel matrix to the other, and with an electrical contact pad 140 in each hole in the grid. The presence of a local defect in the p-n junction, under the doped bands 570 (white cross on FIG. 8A), can generate a leak of charges. This leak of charges prevents the formation of a depletion zone, in a determined radius around the defect (circle shown in dashed lines). A plurality of pixels around the defect, represented cross-hatched on FIG. 8A, is affected by the leak of charges.

Figure 8B:
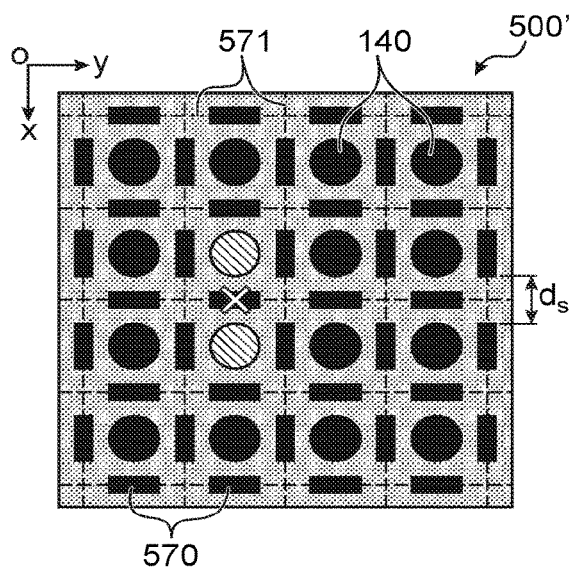

FIG. 8B is a top view that illustrates a photodetection device 500' that is only different from the device in FIGS. 5 and 8A in that the doped bands 570 form detached segments that extend along straight lines 571, from one side of the pixel matrix to the other. Detached means spaced in pairs, without physical contact between the segments. In other words, the doped bands 570 extend in a discontinuous grid, with an electrical contact pad 140 in each hole in the grid. In the example illustrated herein, the pixels in the pixel matrix are distributed in a square or rectangular mesh and each electrical contact pad 140 is surrounded by four distinct doped bands 570 arranged on the four sides of a square or a rectangle.

The spacing $d_s$, between two adjacent doped bands 570, the elongation axes of which are aligned along the same straight line, is less than or equal to twice the lateral extent of the depletion zone in the contact layer. The result is that there will necessarily be depletion zones in the contact layer that extend continuously from one side of the pixel matrix to the other. The lateral extent of a depletion zone is its extent starting from an adjacent end of the associated doped band, measured in a plane parallel to the (x0y) plane. Preferably, the lateral extent of a depletion zone in the contact layer is equal to its extent in the direction of the depth in this same contact layer.

The invention also covers variants of the first embodiment of the invention, wherein the metallic bands forming MOS capacitors extend in a discontinuous grid. Once again, the objective is to limit a number of pixels affected by a leak of charges due to a local defect in the MOS capacitor. The detached metallic bands must then each be polarised individually, while a single electrical contact point is sufficient to polarise the metallic bands when they are arranged in a continuous grid. Additionally or as a variant, the effect of a leak of charges is limited by increasing the absolute value of the polarisation voltage of the metallic bands.

The invention is not limited to the examples described above, and also covers many variants, for example with other pixel distribution meshes, or with a gap gradient in the absorption layer and/or in the contact layer (which does not prevent operation of the barrier layer as a single-pole barrier). This description applies to an "nBn" type device, but the invention also covers "pBn", "pBp" and "nBp" type variants, corresponding to other doping types for the contact layer and/or the barrier layer, and with an n or p doped barrier layer. Depending on the doping type, the single-pole barrier is formed by a gap difference impacting particularly the valence band or the conduction band. In the second embodiment, doping of doped bands is adapted so that they always form a p-n or n-p junction with the contact layer.

Similarly, the invention is not limited to the semiconducting materials mentioned as examples, for the absorption layer, the barrier layer and the contact layer, and it covers all semiconducting materials that might be suitable for infrared photodetection: Si, Ge, AsGa, InP, InSb, InAs, GaSb, AlSb, InGaAs, InAsSb, type II InAs/GaSb superlattice, HgCdTe, etc. In all cases, each of the absorption layer, the barrier layer and the contact layer is advantageously composed of a III-V semiconducting material. An expert in the subject will also be able to implement different sizes of the contact layer and separation elements according to the invention, using classical equations for semiconductors and/or MOS capacitors. In any case, pixellation according to the invention is achieved by simply controlling values of the doping density and thickness, defined in the epitaxy steps. This assures pixellation with very good homogeneity, on the entire pixel matrix and from one pixel matrix to the other. According to yet other variants, the MOS capacitors to delimit pixels in the pixel matrix are not polarised.

The invention is particularly advantageous in the context of a photodetection device in which the barrier layer is composed of a material that might oxidise in the open air, for example a material containing aluminium, and more particularly a III-V alloy containing aluminium, such as AlAsSb.

The invention advantageously covers photodetection devices sensitive in the infrared, in wavelength ranges varying between 0.8 µm and 20 µm, and more preferably between 2.5 µm and 5 µm. The invention relates more particularly to quantum infrared detectors operating at between 150K and 200K.

The invention claimed is:

1. A photodetection device comprising a pixel matrix, wherein each pixel comprises a barrier photodetector, and wherein said pixel matrix comprises:
    an absorption layer, a barrier layer and a contact layer, arranged to be superposed with the barrier layer located between the absorption layer and the contact layer, wherein the barrier layer is configured to form a potential barrier blocking the circulation of majority carriers between the absorption layer and the contact layer and allowing the circulation of minority carriers from the absorption layer to the contact layer; and
    at least one separation element, to delimit the pixels of said pixel matrix;
    said at least one separation element being situated between a first pixel and a second pixel of the pixel matrix, wherein said at least one separation element extends above a continuous region of the contact layer on the side opposite the barrier layer, and
    wherein said at least one separation element is configured to form at least one depletion zone that extends in said continuous region of the contact layer and that forms a potential barrier blocking the circulation of charge carriers from the first pixel to the second pixel of the pixel matrix.

2. The device according to claim 1, wherein the at least one separation element comprises:
    a plurality of metallic bands, arranged along separation lines between pixels, and
    at least one layer made of an electrically insulating material, located between the contact layer and said metallic bands,
    so as to form at least one Metal-Oxide-Semiconductor capacitor that extends along said separation lines between the pixels.

3. The device according to claim 2, wherein the metallic bands are electrically connected to a voltage source configured to supply a non-zero polarisation voltage V1.

4. The device according to claim 2, wherein the voltage source is configured to supply a polarisation voltage with an absolute value greater than or equal to 500 mV.

5. The device according to claim 2, wherein:
each pixel in the pixel matrix also comprises an electrical contact pad, located directly on the contact layer on the side opposite the barrier layer, and
the metallic bands are composed of the same material as said electrical contact pads.

6. The device according to claim 2, wherein:
each pixel in the pixel matrix also comprises an electrical contact pad, located directly on the contact layer on the side opposite the barrier layer, and
at least one layer made of an electrically insulating material covers the entire contact layer except at the locations of said electrical contact pads.

7. The device according to claim 2, wherein the at least one separation element is formed of a Metal-Oxide-Semiconductor capacitor, said at least one layer made of an electrically insulating material lying on and in contact with said contact layer, and at least a metallic bands lying on and in contact with said at least one layer made of an electrically insulating material.

8. The device according to claim 1, wherein the at least one separation element comprises doped bands made of a semiconducting material, each located directly on the contact layer on the side opposite the barrier layer, and each having an n or p doping so as to form a p-n or n-p junction with the contact layer.

9. The device according to claim 8, wherein the doped bands are not connected to a voltage source to polarise the doped bands.

10. The device according to claim 8, wherein the thickness of the doped bands is less than or equal to 15 nm, wherein the thickness is measured along an axis orthogonal to the plane of the pixel matrix.

11. The device according to claim 1, wherein the at least one separation element is in the form of a discontinuous grid, composed of a plurality of detached separation elements.

12. The device according to claim 11, wherein a distance between two separation elements distributed along the same straight line connecting two opposite edges of the pixel matrix is less than or equal to twice the extent of the depletion zone in the contact layer and in the direction of the depth.

13. The device according to claim 11, wherein the pixels in the pixel matrix are distributed in a square or rectangular mesh and wherein each pixel is surrounded by four detached separation elements.

14. The device according to claim 1, wherein, during operation, the at least one depletion zone extends across the entire thickness of the contact layer.

15. The device according to claim 1, wherein the at least one separation element is in the form of a continuous grid.

16. The device according to claim 1, wherein the barrier photodetectors are of the nBn type, with the n doped absorption layer and the n doped contact layer.

* * * * *